United States Patent
Tokuhiro et al.

(10) Patent No.: US 6,794,231 B2
(45) Date of Patent: Sep. 21, 2004

(54) METHOD FOR MANUFACTURING A LIQUID CRYSTAL DISPLAY PANEL HAVING A GATE LINE WITH AT LEAST ONE OPENING

(75) Inventors: Osamu Tokuhiro, Shiga-ken (JP); Hiroyuki Ueda, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/348,909

(22) Filed: Jan. 23, 2003

(65) Prior Publication Data

US 2003/0107040 A1 Jun. 12, 2003

Related U.S. Application Data

(62) Division of application No. 09/502,453, filed on Feb. 11, 2000, now Pat. No. 6,548,831.

(30) Foreign Application Priority Data

Feb. 12, 1999 (JP) ............................................. 11-034227

(51) Int. Cl.⁷ .............................................. H01L 21/00
(52) U.S. Cl. ........................... 438/155; 257/59; 257/72; 257/347; 438/152; 438/155; 438/158; 438/160; 349/139; 349/142; 349/143
(58) Field of Search ........................... 257/72, 59, 347; 438/152, 155, 158, 160; 349/139, 142, 143

(56) References Cited

U.S. PATENT DOCUMENTS

| | | | |
|---|---|---|---|
| 4,804,953 A | | 2/1989 | Castleberry |
| 4,894,690 A | | 1/1990 | Okabe et al. |
| 5,573,959 A | * | 11/1996 | Kodaira et al. ............... 438/30 |
| 5,585,292 A | | 12/1996 | Morita et al. |
| 5,627,088 A | * | 5/1997 | Fukaya et al. ............... 438/155 |
| 5,744,821 A | | 4/1998 | Song |
| 5,861,635 A | | 1/1999 | Song |
| 5,874,326 A | | 2/1999 | Lyu |
| 6,061,105 A | | 5/2000 | Nakagawa |
| 6,172,728 B1 | | 1/2001 | Hiraishi |
| 6,177,289 B1 | | 1/2001 | Crow et al. |
| 6,219,114 B1 | | 4/2001 | Lyu |

FOREIGN PATENT DOCUMENTS

| | | |
|---|---|---|
| JP | 4-08-321621 | 12/1996 |
| JP | 2000-114532 | 4/2000 |

* cited by examiner

*Primary Examiner*—Jerome Jackson
*Assistant Examiner*—Edgardo Ortiz
(74) *Attorney, Agent, or Firm*—Robert M. Trepp, Esq.; McGinn & Gibb, PLLC

(57) ABSTRACT

A liquid crystal display panel (and a method for manufacturing the liquid crystal display panel) includes a gate line and a signal line intersecting the gate line at an intersection portion where the gate line and the signal line intersect each other. The gate line includes at least two conductive portions and at least one opening portion on the intersection portion.

7 Claims, 14 Drawing Sheets

METHOD FOR MANUFACTURING A LIQUID CRYSTAL DISPLAY PANEL HAVING A GATE LINE WITH AT LEAST ONE OPENING

The present Application is a Divisional Application of U.S. patent application Ser. No. 09/502,453 filed on Feb. 11, 2000 now U.S. Pat. No. 6,548,831.

BACKGROUND OF THE INVENTION

1. Field of the Invention

The present invention generally relates to a liquid crystal display (LCD) panel and a method for manufacturing the same, and more particularly to a structure of a gate line and to an intersection portion of the gate line and a signal line.

2. Description of the Related Art

A conventional method for manufacturing an a-Si TFT liquid crystal display panel is described herein below with regard to a liquid crystal device portion. As shown in FIGS. 12(a) and 12(b), a gate electrode 4 and a gate line 5 connected thereto are first formed into a predetermined shape on a glass substrate 2 by a conventional technique. Then, as shown in FIG. 13, a gate insulating film 6, a channel layer 8 and a $SiN_x$ film 10, serving as an etching stopper layer, are successively stacked on the entire surface of the glass substrate 2. As shown in FIGS. 14(a) to 14(c), after coating a resist on the $SiN_x$ film 10, the glass substrate 2 is exposed to light from its back surface side by using the gate electrode 4 having a predetermined shape as a light shielding mask. Subsequently, the glass substrate 2 is subjected to stepper exposure from its front surface side by using a reticle, and then the resist is developed. Thereafter, the $SiN_x$ film 10, other than a portion functioning as an etching stopper (e.g., channel protecting film) 12, is etched with diluted hydrofluoric (HF) acid, and then the resist is removed.

As described above, the etching stopper 12 can be formed through a single exposing step in which the glass substrate 2 is subjected to the stepper exposure from its front surface side by using a reticle. However, in this conventional manufacturing method, the etching stopper 12 is formed through a two-stage exposure. The stages include exposing the substrate 2 to light from its back surface side and exposing the substrate 2 to light from its front surface side.

This approach is used because, when the etching stopper 12 is formed through a single-stage exposing step in which the glass substrate 2 is exposed to light from its front surface side, the alignment with the gate electrode 4 tends to be shifted and cannot be stabilized.

In contrast, if the gate electrode 4 is effectively used in the two-stage exposing step, the etching stopper 12 is disposed at the center of the gate electrode 4 in a self-aligned manner. Referring to FIG. 15, this provides a source electrode 26 and a drain electrode 28 symmetrically positioned about the gate electrode 4, and also reduces overlap areas between the gate electrode 4 and the drain electrode 28 and between the gate electrode 4 and the source electrode 26. Thus, the two-stage exposure can improve a transistor's characteristic.

However, in manufacturing a liquid crystal display panel, there are many complicated, time-consuming steps. Therefore, reducing the number of processes not only improves productivity, but also reduces the manufacturing cost of a LCD panel in which the process cost accounts for a large proportion of the total cost.

After being developed, the resist for forming the etching stopper 12 has a size of approximately 20×10 μm per pixel, and such rectangular resists are arranged side-by-side over the entire surface of an array substrate. Since the area of each resist is relatively small, its adhesion to the underlying nitride film (e.g., the $SiN_x$ film) is low, and hence, the resist is apt to be easily peeled-off. When the resist is peeled-off, the etching stopper 14 cannot be properly formed, which leads to transistor failure.

When the etching stopper layer 10 is etched with diluted hydrofluoric acid, the etching stopper layer 10 is generally over-etched so as not to leave an insufficiently etched portion. However, excessive overetching causes the side surface of the etching stopper 12 to be inclined inward at the foot thereof, thereby resulting in the formation of a "concavity" 15 (which is hidden in a top view), as shown in FIG. 14(c). When films (and/or foreign matter) to be deposited in subsequent steps are attached to the concavity 15, they cannot be removed through cleaning and etching. As a result, as shown in FIG. 15, a leakage current flows between the source electrode 26 and the drain electrode 28 formed on the etching stopper 12, which leads to a leakage failure of the transistor.

In an attempt to overcome the above disadvantages, in Japanese Patent Application No. 10-278689 the present inventors developed a novel method for manufacturing a liquid crystal display panel, which includes a single exposing step by using a gate electrode and a gate line as shielding masks.

However, in the above manufacturing method, the etching stopper layer 12 is not removed from an intersection portion of the gate line where the gate line and the signal line intersect each other. If the etching stopper layer is not removed from the intersection portion, etching solution may easily penetrate into the intersection portion during an etching process, and thus an open defect of the signal line may be latently induced.

SUMMARY OF THE INVENTION

In view of the foregoing and other problems, drawbacks, and disadvantages of the conventional methods, it is an object of the present invention to provide a structure and method for removing an etching stopper layer on an intersection portion of a gate line where the gate line and a signal line intersect each other without using an additional exposing step.

It is another object of the present invention that an etching stopper be formed through only a single exposing step by using a gate electrode and a gate line as shielding masks in the method for manufacturing a liquid crystal display panel. Reducing of the number of steps, especially the number of exposing steps, contributes to productivity improvements and a reduction of the manufacturing cost.

In a first aspect, a liquid crystal display panel according to the present invention includes two or more conductive portions and one or more opening portions on an intersection portion of a gate line where the gate line and a signal line intersect each other. The gate line and the signal line output electrical signals to a liquid crystal device arranged in a matrix pattern. Since the etching stopper layer is removed from the intersection portion having opening portions, penetration of the etching solution (e.g., which would lead to a break in the signal line formed on the intersection portion) can be prevented.

In a second aspect, a method for manufacturing a liquid crystal display panel according to the present invention includes forming a gate insulating film, a channel layer and an etching stopper layer on a transparent substrate bearing a gate electrode and the gate line, and exposing the substrate to light from its back surface side by using the gate electrode and the gate line as light shielding masks by a photolithography technique. Then, the resist is developed and the etching stopper layer is etched, and thereby an etching stopper is formed. Thus, the inventive manufacturing method forms an etching stopper using a single-stage exposing step.

Further, two or more conductive portions and one or more opening portions are formed on the intersection portion of the gate line where the gate line and the signal line intersect each other, and the resist is removed from the opening portion. During the etching step of forming the etching stopper layer, since the etching stopper layer is also etched from the opening portion side, and since the etching stopper layer near (e.g., adjacent) the opening portion is also etched by the side-etching effect, the etching stopper layer is removed from the intersection portion.

In the liquid crystal display panel and the method for manufacturing the same according to the present invention, the exposing step of forming the etching stopper layer includes only one step in which the gate electrode and the gate line are used as shielding masks. Since the inventive manufacturing method does not include a time-consuming exposing step in which a shielding mask, such as a reticle, is used and a high precision positioning of the shielding mask is required, productivity is dramatically increased.

The present disclosure relates to subject matter contained in Japanese Patent Application No. 11-034227, filed Feb. 12, 1999, which is expressly incorporated herein by reference in its entirety.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1A:
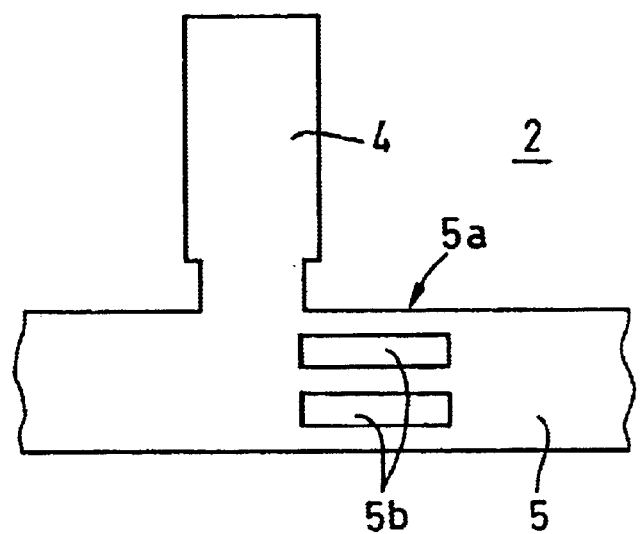
FIGS. 1(a) and 1(b) are an enlarged plan view and an enlarged sectional view, respectively, illustrating a procedure for forming a gate electrode in the method for manufacturing a liquid crystal display panel according to the present invention.

Referring now to the drawings, and more particularly to FIGS. 1–11(c), in which only a portion corresponding to one pixel is shown for simplification, a preferred embodiment of the liquid crystal display panel and the method for manufacturing the same will be described.

Figure 1B:
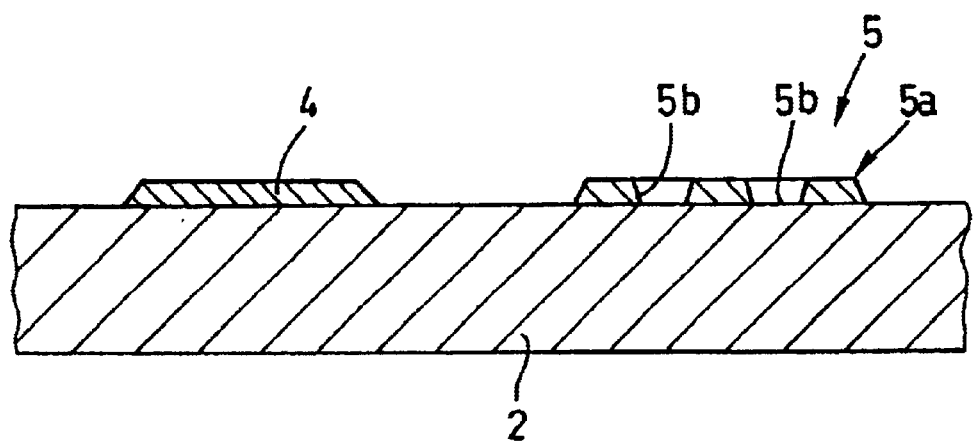

As shown in FIGS. 1(a) and 1(b), a gate electrode 4 and a gate line 5 connected thereto are first formed on a transparent substrate 2. The most preferable transparent substrate includes a glass substrate, but a resin substrate or a flexible substrate can be used provided it is transparent and, in particular, has good heat-resistance.

The gate electrode 4 and the gate line 5 include one or more layers of at least one element selected from the group consisting of MoW, Cr, Cu, Ni, Al, Mo, Ag and the like. Preferably, the gate electrode 4 and the gate line 5 have excellent conductivity, excellent adhesion to the transparent substrate 2, and more preferably, have a property such that atoms and molecules of the electrode material are not diffused into a gate insulating film 6 to be formed thereon. Also, the gate electrode 4 and the gate line 5 are formed on the entire surface of the transparent substrate 2 by evaporating a specified metal or by adhering a metal foil.

After the resultant substrate 2 is coated with a photoresist, and subsequently subjected to stepper exposure by using a reticle, the resist is developed. Subsequently, after the metal layer other than a portion functioning as the gate electrode 4 and the gate line 5 is removed through a plasma etching procedure, the photoresist is removed to obtain the gate electrode 4 and the gate line 5.

Then, two rectangular slit-shaped opening portions 5b are formed on the portion (e.g., intersection portion) 5a of the gate line 5 where the gate line and the signal line intersect each other through an insulating layer described below.

The opening portions 5b have widths and sizes such that the resist applied thereto can be removed in the developing step, and that the etching stopper layer can be removed by being wet-etched. Conductive portions of the gate line 5 on the intersection portion 5a have widths (e.g., approximately 4 $\mu$m or less in width) such that the etching stopper layer on the conductive portions (e.g., on the intersection portion of the gate line 5) can be removed almost completely by side-etching.

This results from wet-etching the etching stopper layer on the opening portions 5b, without enlarging the conduction resistance of the gate line 5. In addition, and preferably, the conductive portions of the gate line 5 on the intersection portion 5a have sizes such that excessive overetching is not necessary.

Figure 2:
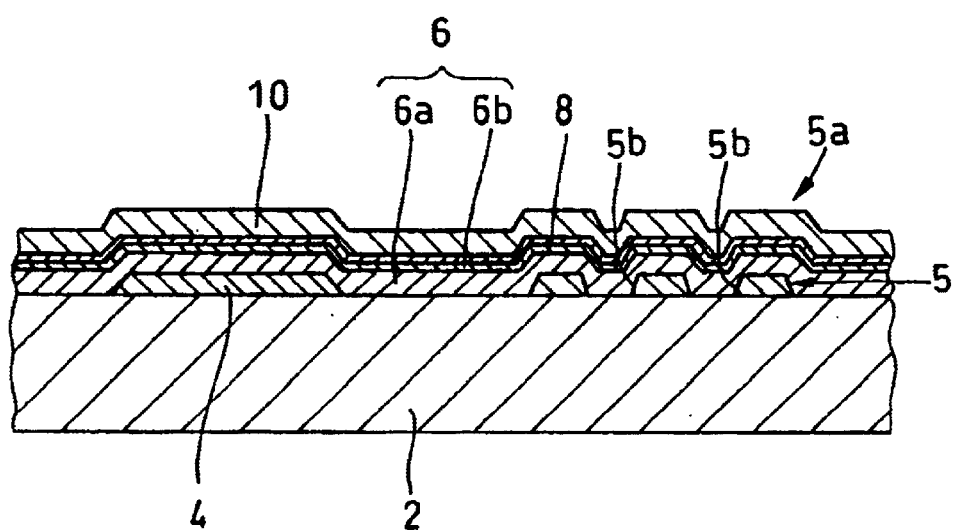
FIG. 2 is an enlarged sectional view illustrating a major part of a procedure for forming a gate insulating film, a channel layer and an etching stopper layer.

Next, as shown in FIG. 2, a gate insulating film 6, a channel layer 8 and an etching stopper layer 10 are successively formed in that order on the entire transparent substrate 2 having a gate electrode 4 and a gate line 5. The gate insulating film 6 is preferably made of one or more layers of one or more materials.

Specifically, $SiO_x$ and $SiN_x$ are preferably used as a material for the gate insulating film 6, and more preferably, a $SiO_x$ film 6a is formed on the transparent substrate 2 side and a $SiN_x$ film 6b is formed on the $SiO_x$ film 6a. The $SiN_x$ film 6b improves adhesion of the channel layer 8 to be formed thereon. Amorphous silicon (a-Si) is preferably used for the channel layer 8, and $SiN_x$ is preferably used as the material for the etching stopper layer 10 to be formed thereon. All of these layers are formed by conventional techniques.

Then, after the photoresist (not shown) is applied to the etching stopper layer 10, the transparent substrate 2 is exposed to light by using the gate electrode 4 and the gate line 5 as light shielding masks from its back surface side (e.g., the surface side not bearing the etching stopper layer 10 and the like). After the photoresist is developed, a part of the photoresist which is substantially the same shape as the gate electrode 4 and the gate line 5 is left on the gate electrode 4 and the gate line 5. At this time, holes having the same shape as the opening portions 5b are formed on the photoresist on the intersection portion 5a of the gate line 5 by the developing step.

Figure 3A:
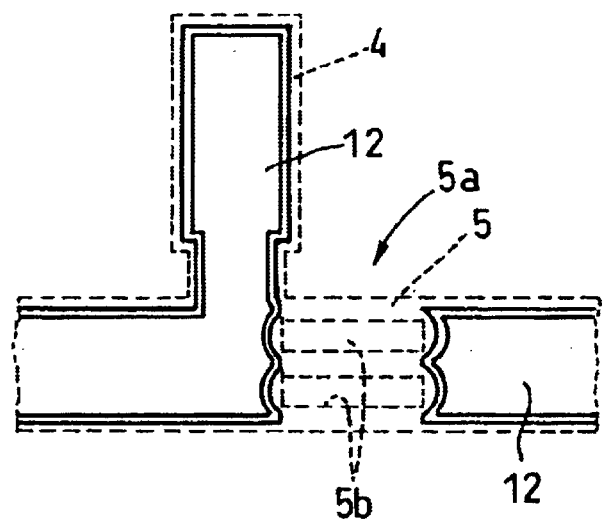
FIGS. 3(a) and 3(b) are an enlarged plan view and an enlarged sectional view, respectively, illustrating a procedure for forming an etching stopper.
Figure 3B:
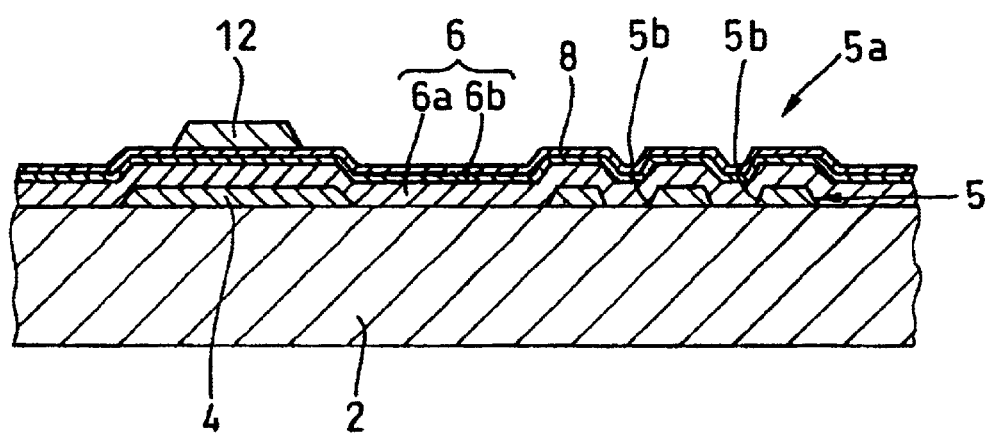

Referring to FIGS. 3(a) and 3(b), after a heat-treatment of the photoresist, only the etching stopper layer 10 is wet-etched and the etching stopper 12, having substantially the same shape as the photoresist (e.g., substantially the same shape as the gate electrode 4 and gate line 5) are formed. However, the etching stopper 12 is removed from the intersection portion 5a, on which the opening portions 5b are formed, by being side-etched from the width direction (e.g., side-etching effect).

Figure 4:
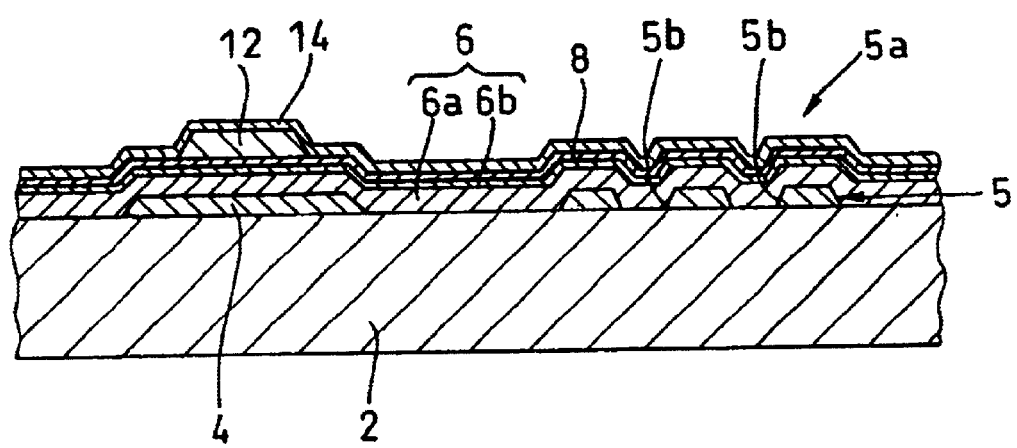
FIG. 4 is an enlarged sectional view illustrating a procedure for forming a source/drain layer.

As shown in FIG. 4, after removing the photoresist, a source/drain layer 14 is formed on the transparent substrate 2 bearing the etching stopper 12. The material for the source/drain layer 14 is an $n^+$ type a-Si, and is used for attaining ohmic contact with a source/drain electrode to be formed thereon. After forming the source/drain layer 14, a photoresist is applied to the resultant substrate 2.

As shown in FIGS. 5(a) to 5(d), the resultant substrate 2 is subjected to stepper exposure using a reticle having a mask substantially the same shape as the signal line (24), including the source/drain electrode under layer 16, and followed by plasma etching. Through the plasma etching, the source/drain layer 14, the etching stopper 12, the channel layer 8 and the $SiN_x$ film 6b of the gate insulating film 6 are simultaneously etched into substantially the same shape as the signal line (24).

Figure 6:
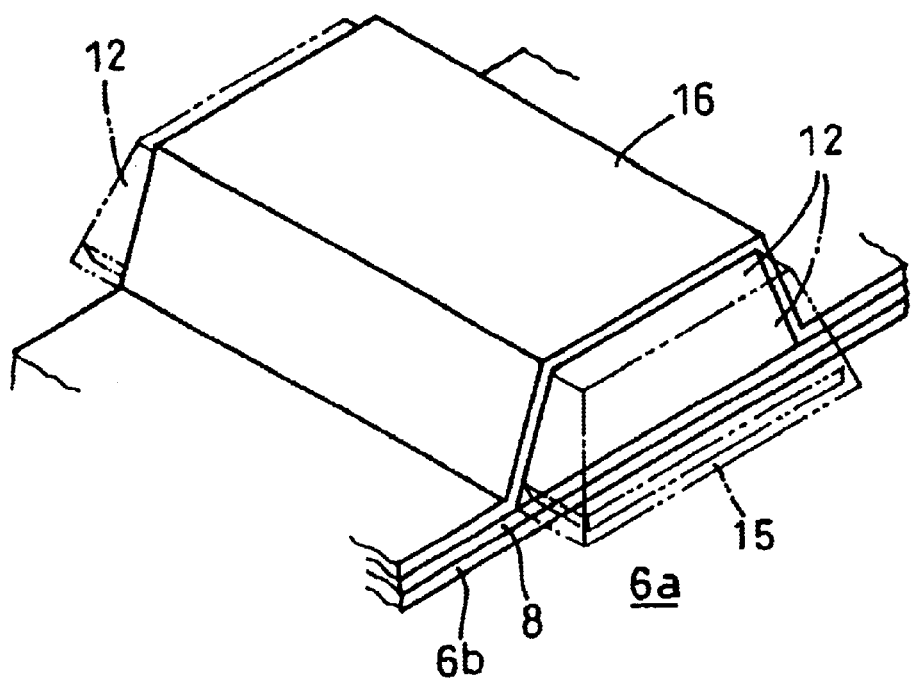
FIG. 6 is an enlarged perspective view showing a liquid crystal device portion formed with the procedure of FIGS. 5(a) to 5(d)

As shown with dashed, lines in FIG. 6, both ends, in the channel width direction, of the etching stopper 12 are removed through the etching.

As a result of the plasma etching, the source/drain electrode under layer 16, the etching stopper 12, the channel layer 8 and the $SiN_x$ film 6b are formed at substantially right angles to the transparent substrate 2 or they are tapered in that order. Thus, the tilt angle of both side surfaces of the etching stopper 12 is generally different.

Figure 5A:
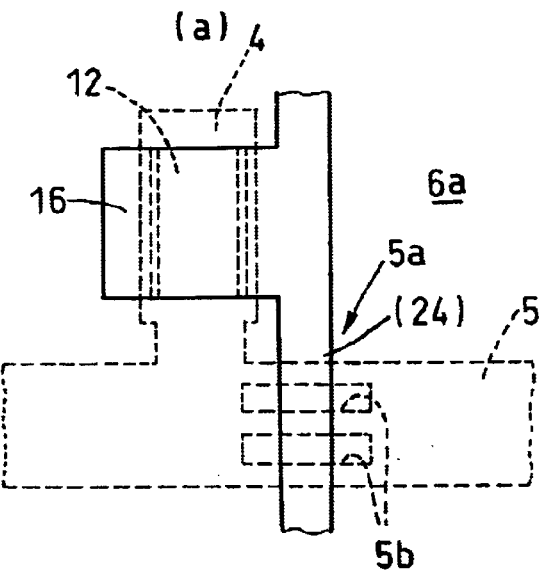
FIGS. 5(a) to 5(d) are views illustrating a procedure for processing the source/drain layer, with FIG. 5(a) being an enlarged plan view, FIG. 5(b) being an enlarged sectional view, FIG. 5(c) being a sectional view taken on line c-c of FIG. 5(b), and FIG. 5(d) being a sectional view of a storage capacity portion and a pad portion.
Figure 5B:
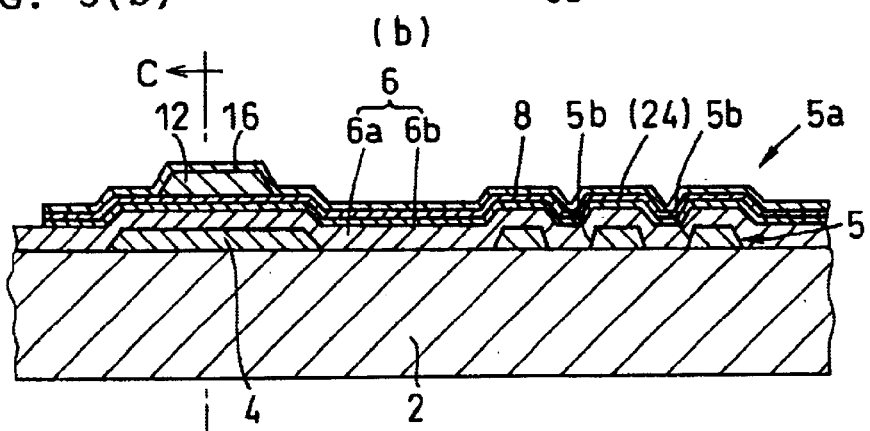
Figure 5C:
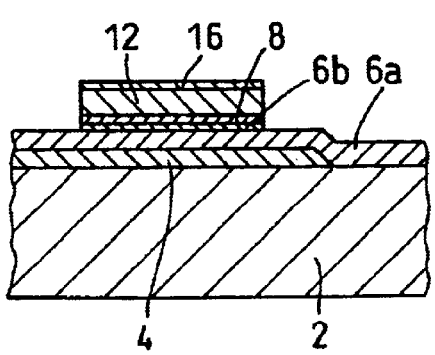
Figure 5D:
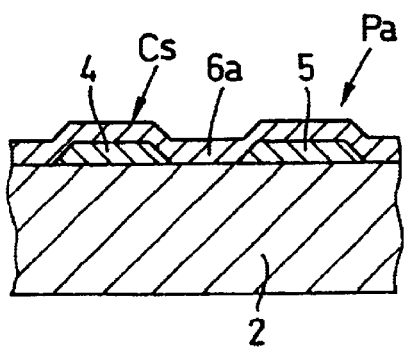

In FIG. 5(d), Cs and Pa indicate a storage capacity portion and a pad portion, respectively. As shown in FIGS. 5(a) and 5(b), an inter-layer insulating film on the intersection portion 5a of the signal line (24) and the gate line 5 has a laminated structure including gate insulating films 6 (e.g., 6a, 6b) and channel layer 8. Thereafter, a transparent conductive film of indium-tin oxide (ITO) or the like, functioning as a pixel electrode layer is formed on the entire surface of the substrate 2.

Figure 7:
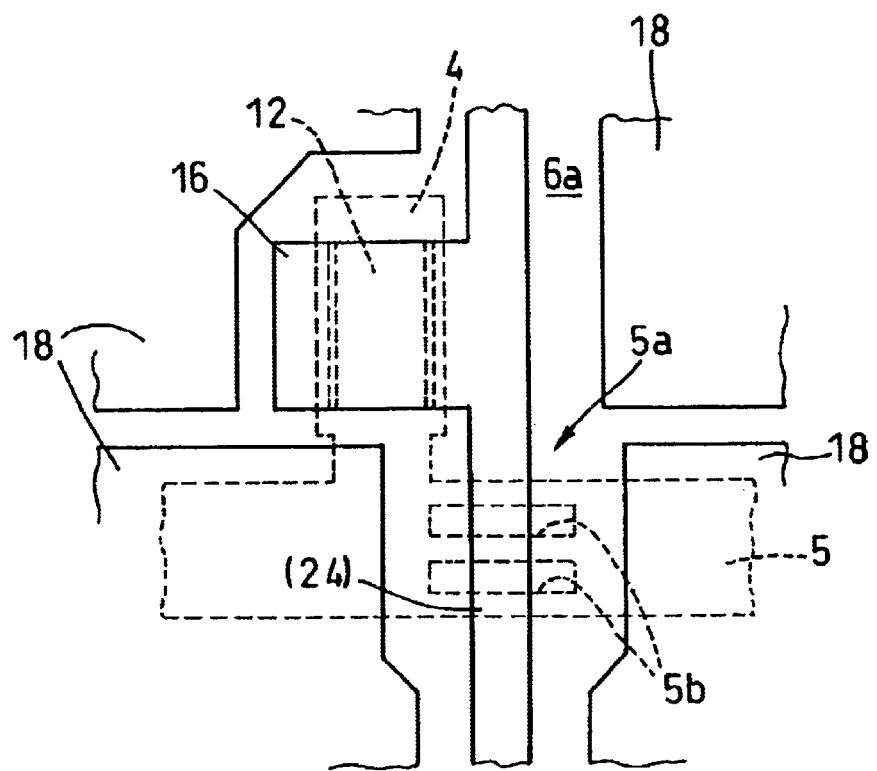
FIG. 7 is an enlarged plan view illustrating a procedure for forming a transparent conductive film.

Referring to FIG. 7, pixel electrode layers 18 having a predetermined shape are formed by a known method comprising the steps of coating of a photoresist, stepper exposure, development of the photoresist, and wet etching, and then removing the photoresist.

Figure 8:
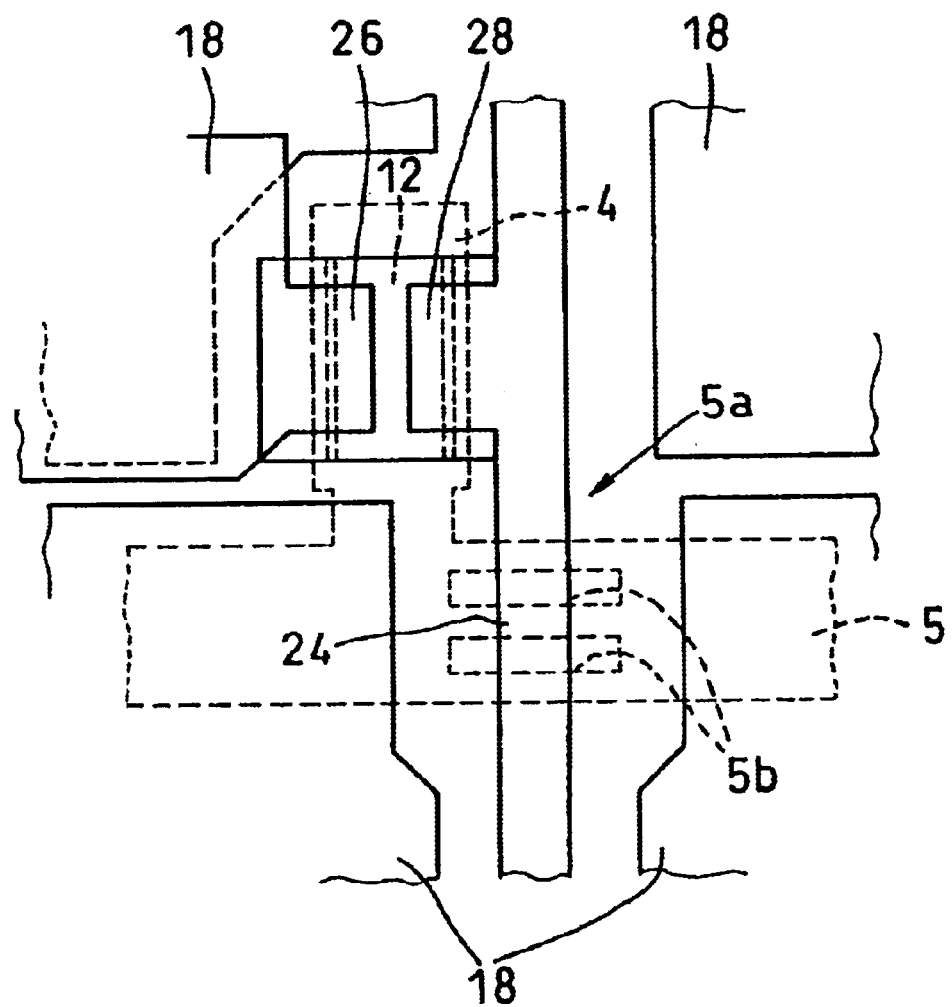
FIG. 8 is an enlarged plan view illustrating a procedure for forming a signal line.
Figure 9A:
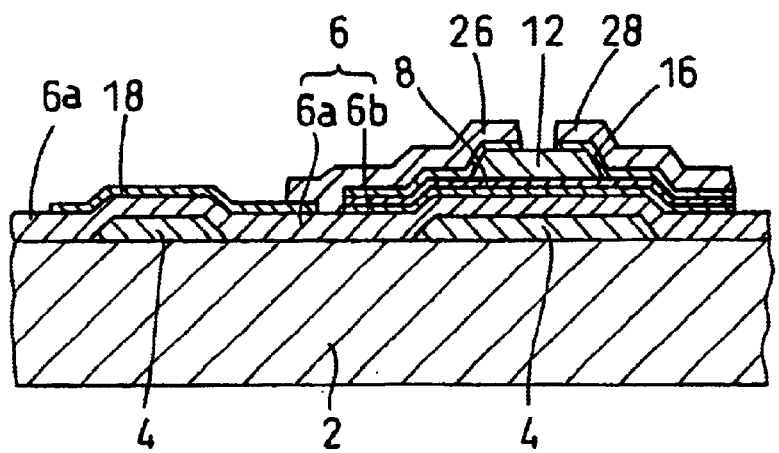
FIG. 9(a) is an enlarged sectional view of the procedure shown in FIG. 8.
Figure 9B:
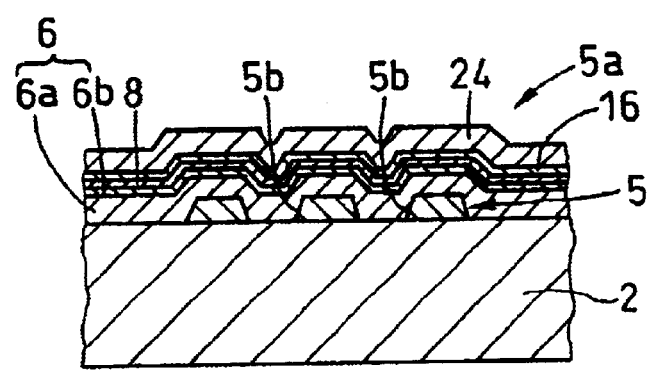
FIG. 9(b) is an enlarged sectional view illustrating an intersection portion of a gate line and a signal line.

As shown in FIGS. 8, 9(a) and 9(b), conductive metal is then deposited to form the signal line 24, the source electrode 26, the drain electrode 28, and the like. The conductive metal includes one or more layers of one or more metals having good conductivity. Preferably, the conductive metal is a lamination including a Mo layer, an Al layer and another Mo layer. However, the invention is not limited to this combination.

After forming one or more layers of the conductive metal by evaporation or the like, the steps of coating of a resist, stepper exposure and development of the resist are successively carried out in the same manner as described above. Then, the conductive metal is etched by a wet etching method to form the signal line 24, the source electrode 26, the drain electrode 28 and the like.

Figure 10:
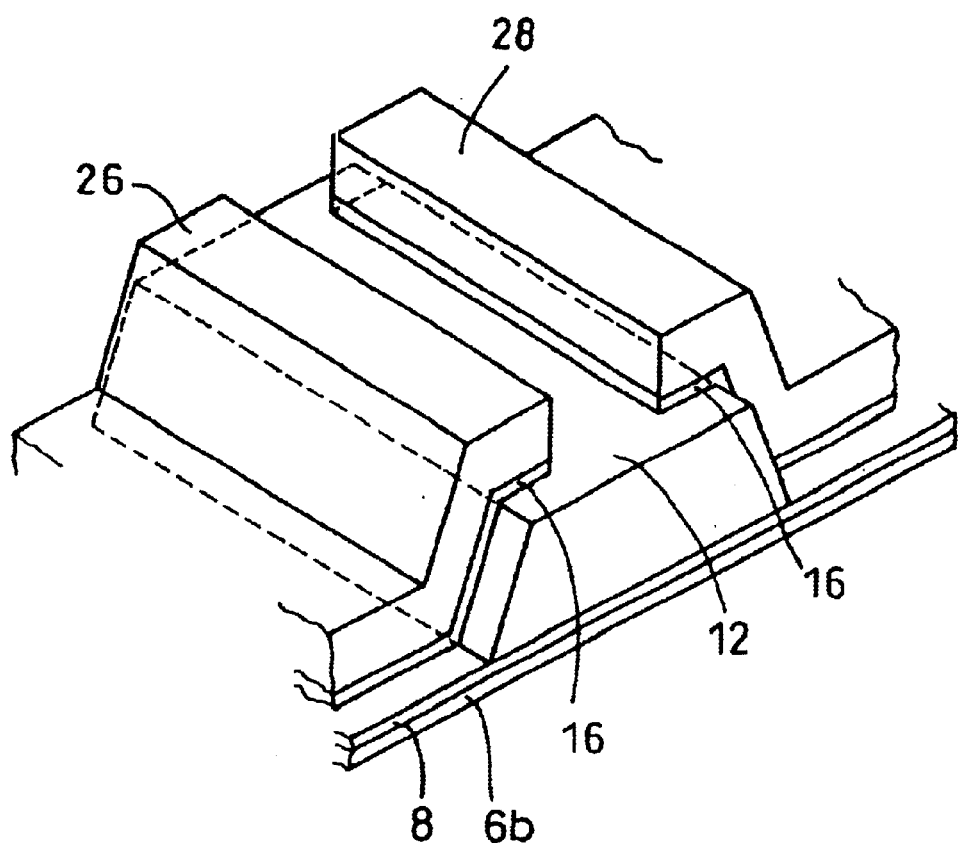
FIG. 10 is an enlarged perspective view of the liquid crystal device portion shown in FIG. 8.

Thereafter, the exposed source/drain electrode under layer 16, between the source electrode 26 and the drain electrode 28, is etched by plasma etching. In this plasma etching, the source/drain electrode under layer 16 of $n^+$ type a-Si is etched as shown in FIG. 10. However, the channel layer 8 can be prevented from being etched by the etching stopper 12 of $SiN_x$. Thereafter, a liquid crystal display panel is manufactured by a known method.

In the aforementioned manufacturing method, the etching stopper 12 is formed only by exposing light to the substrate 2 from its back surface by using the gate electrode 4 and the gate line 5 as shielding masks, as described with reference to FIGS. 3(a) and 3(b).

The manufacturing method of the present invention includes one exposure step less than a conventional manufacturing method. In the conventional method having an exposing step using a reticle as a shielding mask, a high precision positioning of the shielding mask is required, which is a time-consuming task. Therefore, in the manufacturing method of the present invention, which includes one exposure step less than the conventional method, productivity and yields are dramatically increased, and quality can be stabilized.

In addition, since the resist for forming the etching stopper is formed on the entire surface of the gate electrode 4 and the gate line 5, and a bonded area of the resist formed by the present method is larger than that of a resist formed by a conventional method, the resist of the invention can hardly be peeled-off. Hence, an area of the photoresist for forming the etching stopper 12 is small in the conventional method, and therefore more likely to be peeled-off.

However, in the present method, a photoresist is formed on the entire surface of the gate electrode 4 and the gate line 5, thereby decreasing the probability of poor formation of resists and therefore decreasing the occurrence rate of defective transistors. Furthermore, since high-priced reticles are not used in the method of the present invention, the production cost can be sharply reduced.

Furthermore, the etching stopper 10 on the intersection portion 5a of the gate line 5 where the gate line 5, and the signal line 24 intersect each other, is removed by being side-etched in a wet-etching process. For this reason, etching solution does not penetrate through the signal line 24, and therefore damage to the signal line 24 can be prevented.

Further, as described with reference to FIGS. 5(a) to 5(d) and FIG. 6, both end portions of the etching stopper 12, having a nearly identical shape with the gate electrode 4 and the gate line 5, are removed concurrently with the formation of the source/drain electrode under layer 16. For this reason, in an etching step of etching stopper layer 10, as shown in FIG. 6, even when excessive overetching produces a concavity 15 in the shape of an inverse taper, the concavity 15 spreading over the source electrode 26 and the drain electrode 28 can be removed by being etched.

As a result, since no leakage occurs between the source electrode 26 and the drain electrode 28, the performance and the quality can be improved. Moreover, the defect rate of products can be significantly reduced.

A preferred embodiment of the liquid crystal display panel and the method for manufacturing the same according to the present invention has thus been described above. However, the present invention is not limited to the above embodiment.

Figure 11A:
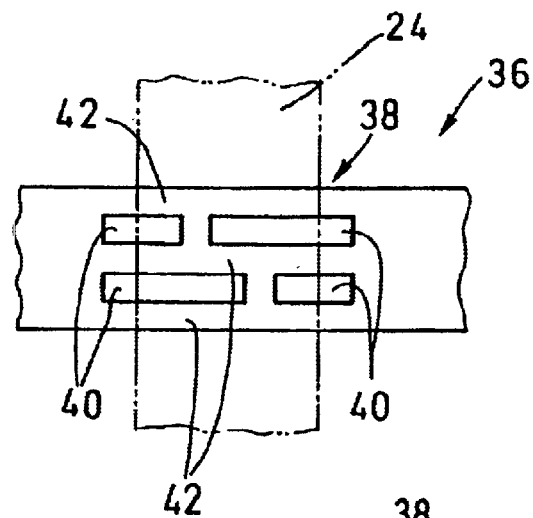
FIGS. 11(a) to 11(c) are enlarged plan views illustrating another embodiment of the intersection portion of the gate line.

For example, as shown in FIG. 11(a), opening portions 40 formed on the intersection portion 38 of the gate line 36 where the gate line 36, and the signal line 24 intersect each other, can be a combination of long slits and short slits, and each end of the opening portions 40 can overlap one another. In this arrangement, even if the conductive portions 42 are down, the electricity can be secured.

Figure 11B:
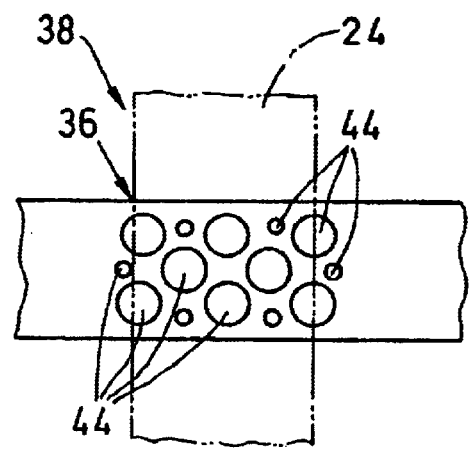

Also, as shown in FIG. 11(b), opening portions 44 formed on the intersection portion 38 of the gate line 36 where the gate line 36 and the signal line 24 intersect each other, can have a circular shape. The circular opening portions 44 have sizes such that the photoresist can be removed in the developing step, the etching stopper layer can be wet-etched through the circular holes formed in the developing step, and the etching stopper layer in the vicinity of opening portions 44 can be side-etched. Accordingly, the opening portions 44 are not limited to circles but can be any shape such as triangles, squares, pentagons, hexagons, ovals, oblongs or irregular shapes.

Figure 11C:
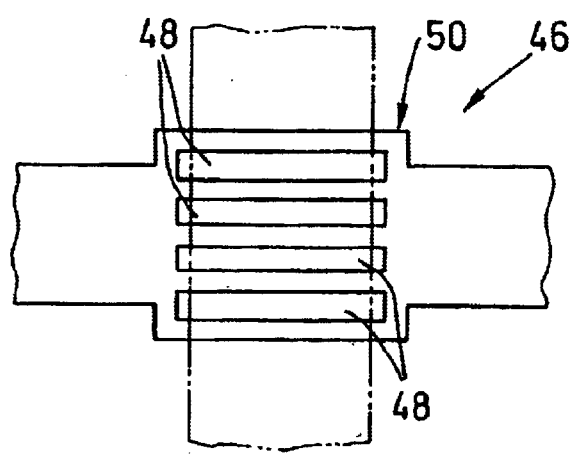
Figure 12A:
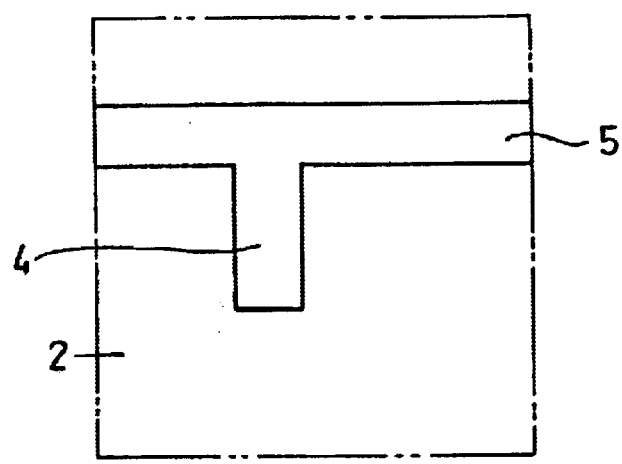
FIG. 12(a) and FIG. 12(b) are an enlarged plan view and an enlarged sectional view, respectively, illustrating a procedure for forming a gate electrode in a conventional method for manufacturing a liquid crystal display panel.
Figure 12B:
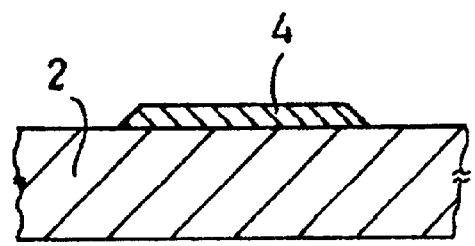
Figure 13:
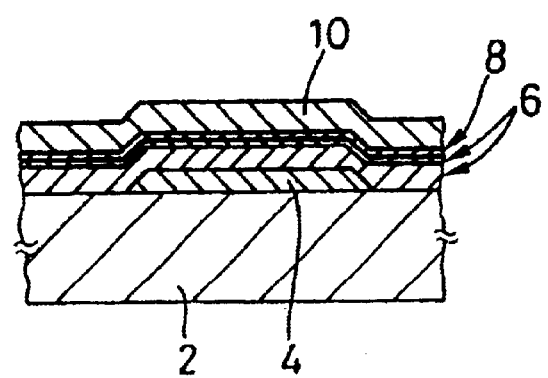
FIG. 13 is an enlarged sectional view illustrating a procedure for forming a gate insulating film, a channel layer and an etching stopper layer in a conventional method for forming a liquid crystal display panel.
Figure 14A:
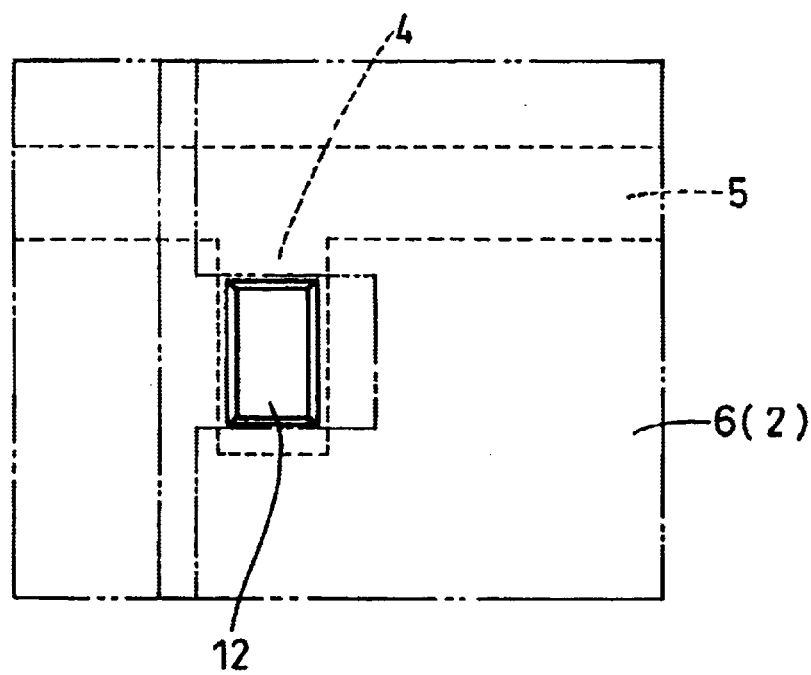
FIGS. 14(a) to 14(c) are diagrams illustrating a procedure for forming the etching stopper in a conventional method for forming a liquid crystal display panel, with FIG. 14(a) being an enlarged plan view, FIG. 14(b) being an enlarged sectional view, and FIG. 14(c) being an explanatory enlarged perspective view of the etching stopper.
Figure 14B:
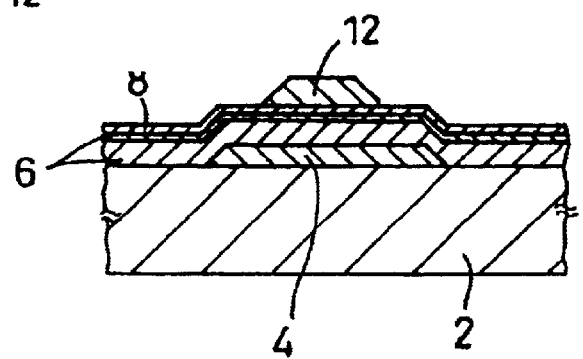
Figure 14C:
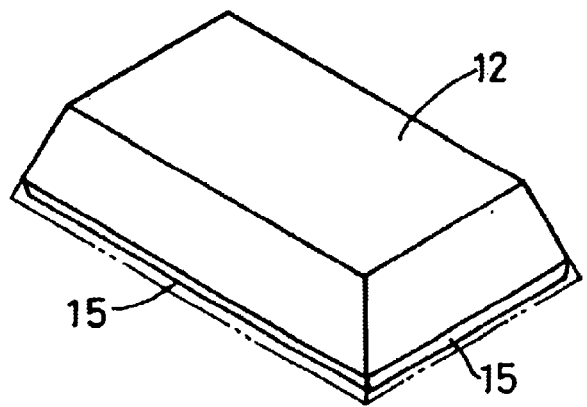
Figure 15:
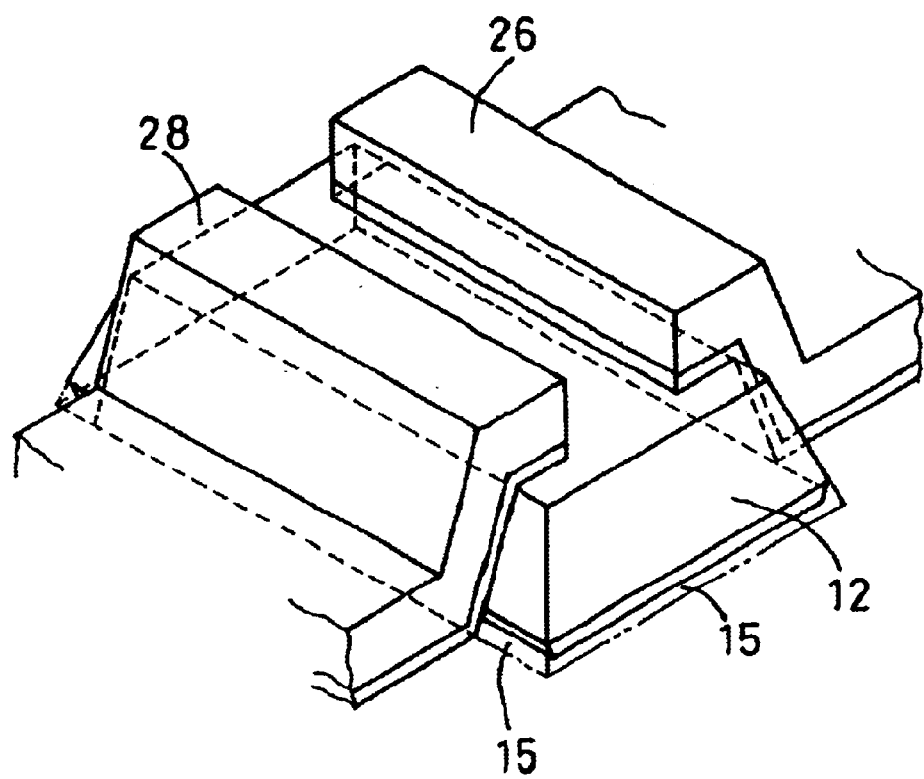
FIG. 15 is an enlarged perspective view of a liquid crystal device portion manufactured by the conventional method.

Furthermore, as shown in FIG. 11(c), if the width of the gate line 46 is too narrow to form opening portions 48, it is possible to widen the width of the intersection portion 50.

Further, the resist is not limited to a wet-type, but may be a film-like resist. The wet-type resist is formed into film by a coating or spraying method. The film-like resist is thermally compressed. In addition, the resist may be either a negative-type or positive-type. However, a form of shielding mask is reversed in accordance with the resist-type to be employed.

Further, the etching method can be suitably selected according to a material to be etched, but either one of wet-etching or dry-etching can be employed. The dry-etching method is not limited to plasma-etching, but can include chemical gas phase etching such as reactive ion etching, ion beam etching or reactive ion beam etching, or other kinds of etching.

The shielding mask may be a mask formed for a one-time exposure step, but it may also be a reticle type which can be used for repeated exposure steps by moving the mask (e.g., stepper exposure). A suitable shielding mask is used in consideration of factors related to productivity, production cost, availability, and so forth.

A transparent substrate is used as the substrate. However, it is not limited to a flat substrate, but may be a curved substrate. In addition, various changes, alterations and modifications may be made to the embodiments by those skilled in the art without departing from the spirit and the scope of the present invention.

In the liquid crystal display panel and the method for manufacturing the same according to the present invention, the exposing step of the etching stopper layer includes a single step in which the gate electrode and the gate line are used as shielding masks. Since the manufacturing method for the present invention does not include a time-consuming exposing step in which a shielding mask, such as a reticle, is used and a high precision positioning of the shielding mask is required, productivity is dramatically increased.

Preferably, the etching stopper layer on the intersection portion of the gate line where the gate line, and the signal line intersect each other, is removed by being side-etched by the opening portions formed on the gate line. For this reason, etching solution, or the like, does not penetrate through the signal line, and therefore the signal line cannot be broken down easily.

In addition, since the resist for forming the etching stopper is formed on the entire surface of the gate electrode 4 and the gate line 5, and a bonded area of the resist formed by the present method is larger than that of resist formed by a conventional method, the poor formation of resists and the occurrence rate of defective transistors are decreased. Furthermore, since high-priced reticles are not used in the method of the present invention, the production cost can be sharply reduced.

Furthermore, since both end portions of the etching stopper, which is formed in the channel direction, are removed concurrently with the formation of the source/drain electrode under the layer, even when excessive overetching produces a concavity in the shape of an inverse taper in an etching step of an etching stopper layer, the concavity spreads over the source electrode and the drain electrode can be removed by etching. As a result, since no leakage occurs between the source electrode and the drain electrode, the performance and the quality can be improved. Thus, the rate of defective products can be significantly reduced.

While the invention has been described in terms of preferred embodiments, those skilled in the art will recognize that the invention can be practiced with modification within the spirit and scope of the appended claims.

What is claimed is:

1. A method for manufacturing a liquid crystal display panel, comprising:

forming a gate electrode and a gate line on a transparent substrate, wherein said gate line comprises at least two conductive portions and at least one opening portion on an intersection portion where said gate line and said signal line intersect each other;

forming a gate insulating film on an entire surface of said substrate;

forming a channel layer on said gate insulating film;

forming an etching stopper layer on said channel layer;

forming a resist film on said etching stopper layer;

exposing the substrate to light from its back surface by using the gate electrode and the gate line as shielding masks;

developing said resist film;

etching said etching stopper layer, and at the saline time, side-etching the etching stopper layer portion in an upper vicinity of the at least one opening portion of the gate line; and removing said resist film.

2. The method for manufacturing a liquid crystal display panel according to claim 1, wherein said etching the etching stopper layer comprises wet-etching the etching stopper layer by using dilute fluoride acid.

3. The method for manufacturing a liquid crystal display panel according to claim 1, further comprising:

forming a source/drain layer on an entire surface of the substrate;

forming a resist on the source/drain layer;

exposing the substrate to light;

developing the resist;

etching the source/drain layer and a remaining portion of the etching stopper layer through chemical gas phase etching; and removing the resist.

4. The method for manufacturing a liquid crystal display panel according to claim 3, wherein said source/drain layer is made from an $n^+$ type a-Si layer.

5. The method for manufacturing a liquid crystal display panel according to claim 3, wherein said exposing the substrate to light comprises conducting a stepper exposure by using a reticle.

6. The method for manufacturing a liquid crystal display panel according to claim 3, further comprising:

forming a transparent electrode on said substrate; and forming said signal line on said substrate.

7. The method for manufacturing a liquid crystal display panel according to claim 2, wherein said signal line is made from a lamination including a Mo layer, an Al layer, and a second Mo layer.

* * * * *